United States Patent [19]

Chapman et al.

[11] Patent Number: 5,947,753

[45] Date of Patent: *Sep. 7, 1999

[54] HIGH DENSITY CONNECTOR ARRANGEMENT FOR A CIRCUIT BOARD MODULE

[75] Inventors: Robert Kenneth Chapman, West Winfield; Ritch Allen Selfridge, Sidney, both of N.Y.

[73] Assignee: Amphenol Corporation, Wallingford, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/782,792

[22] Filed: Jan. 13, 1997

[51] Int. Cl.[6] ...................................................... H01R 9/09
[52] U.S. Cl. ............................ 439/79; 361/749; 361/803; 439/67
[58] Field of Search ................................ 439/67, 637, 79; 361/749, 785, 789, 803

[56] References Cited

U.S. PATENT DOCUMENTS

| | | | |
|---|---|---|---|
| 3,492,538 | 1/1970 | Fergusson | 439/67 |
| 4,045,114 | 8/1977 | Dechelette | 439/79 |
| 4,296,457 | 10/1981 | Hahlganss | 439/749 |
| 4,425,015 | 1/1984 | Rizzo | 439/83 |
| 4,682,828 | 7/1987 | Piper et al. | 439/77 |
| 4,708,659 | 11/1987 | Wozniczka | 439/62 |
| 4,734,042 | 3/1988 | Martens et al. | 439/62 |
| 4,808,115 | 2/1989 | Norton et al. | 439/79 |
| 4,913,656 | 4/1990 | Gordon et al. | 439/67 |
| 4,992,052 | 2/1991 | Verhoeven | 439/62 |
| 4,997,379 | 3/1991 | Buck et al. | 439/59 |
| 5,085,601 | 2/1992 | Buchter et al. | 439/660 |
| 5,090,116 | 2/1992 | Henschen et al. | 29/827 |
| 5,090,911 | 2/1992 | Welsh | 439/79 |
| 5,123,851 | 6/1992 | Young et al. | 439/67 |
| 5,199,885 | 4/1993 | Korsunsky et al. | 439/79 |
| 5,308,248 | 5/1994 | Davidge et al. | 439/59 |
| 5,322,447 | 6/1994 | Okada | 439/79 |
| 5,342,208 | 8/1994 | Kobayashi et al. | 439/79 |
| 5,764,497 | 6/1998 | Mizumo | 439/803 |

FOREIGN PATENT DOCUMENTS 2-250388   10/1990   Japan ............................... H05K 1/14

*Primary Examiner*—Neil Abrams
*Assistant Examiner*—T C Patel
*Attorney, Agent, or Firm*—Bacon & Thomas, PLLC

[57] ABSTRACT

A circuit board module includes a plurality of high density edge connectors in which the contacts are arranged in rows, with contact tails extending from the connectors for electrical connection to a circuit board carrying electrical components. Instead of terminating the contacts directly to pads or terminals on the principal surface of the circuit board on which the electrical components are situated, however, the contact tails are terminated to pads or terminals on pairs of intermediate circuit boards connected to the main boards, the intermediate circuit boards each providing two termination surfaces rather than one, thereby effectively doubling the space available for termination. The intermediate circuit boards are connected to the main circuit board by a rigid-flex interconnection, thus facilitating assembly of the connectors to a heatsink or frame of the circuit board following termination of the contact tails to the intermediate circuit boards.

24 Claims, 6 Drawing Sheets

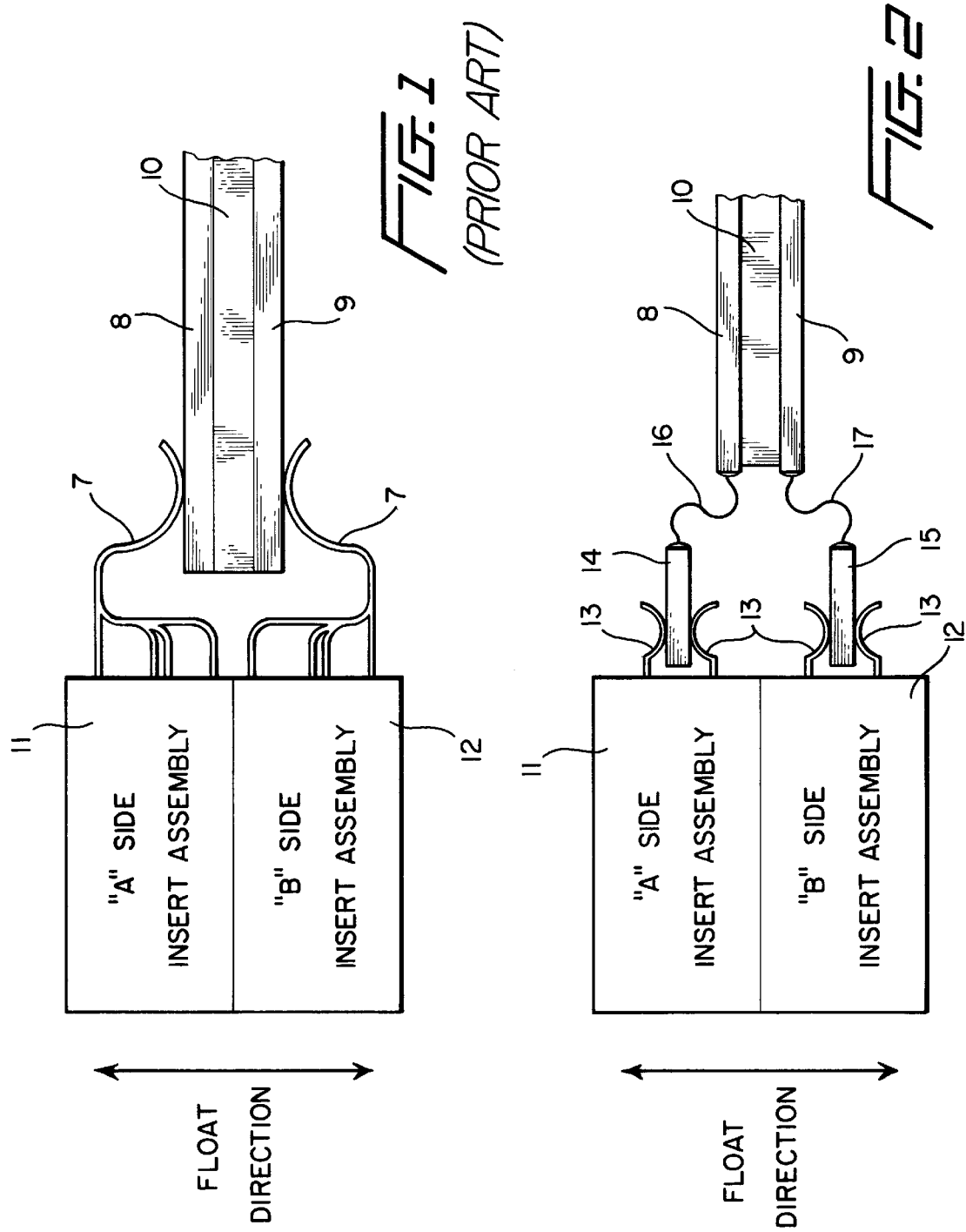

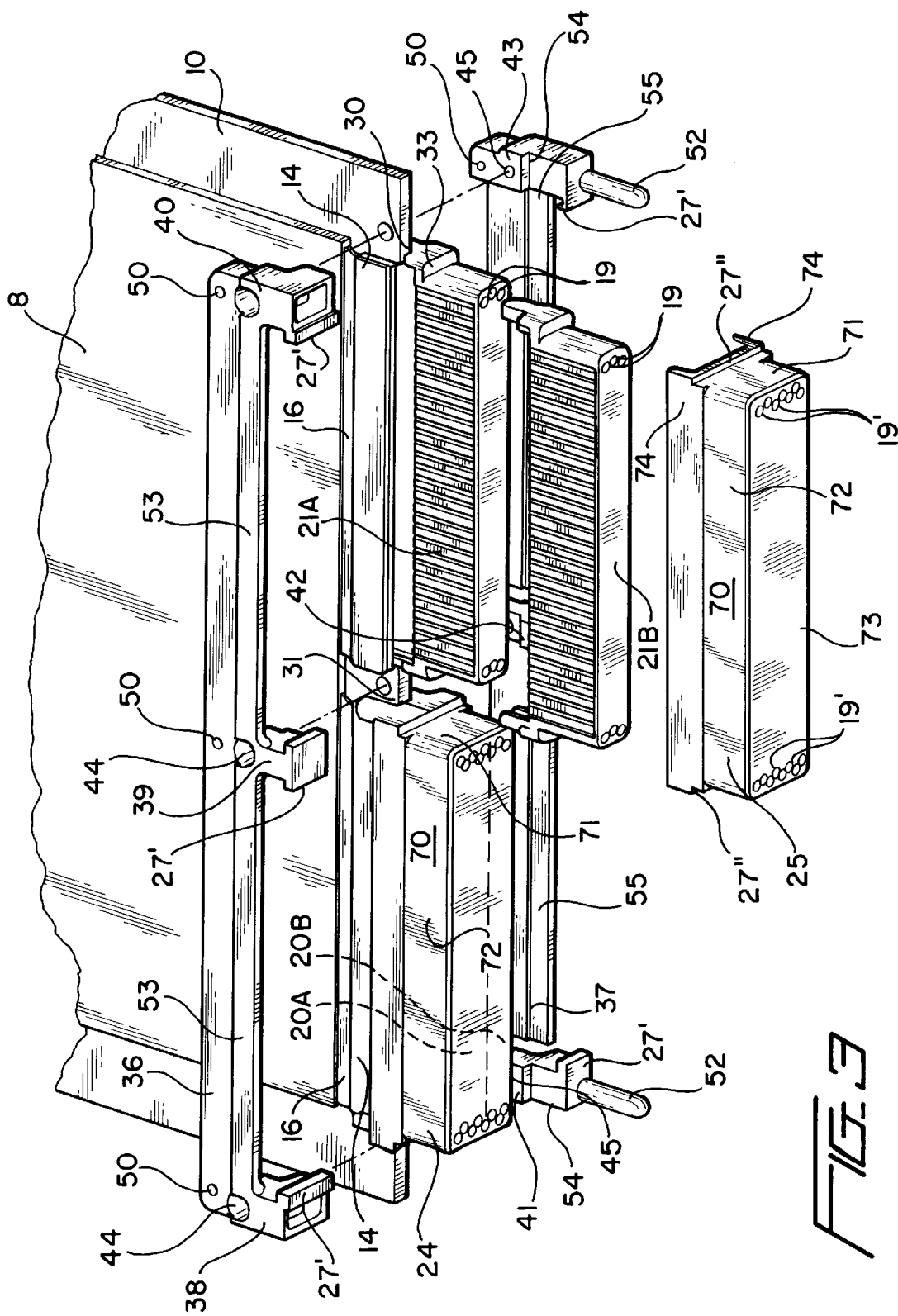

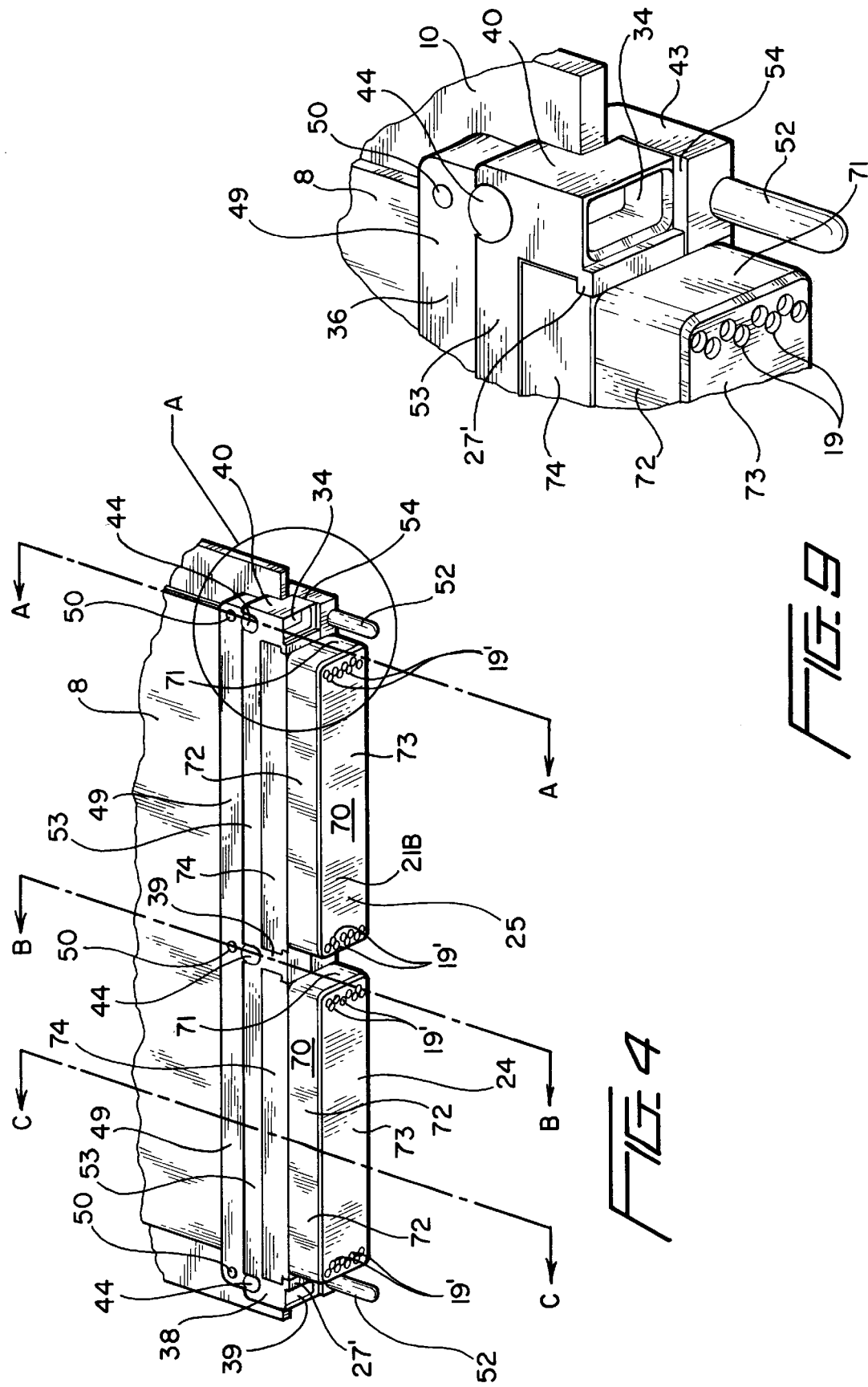

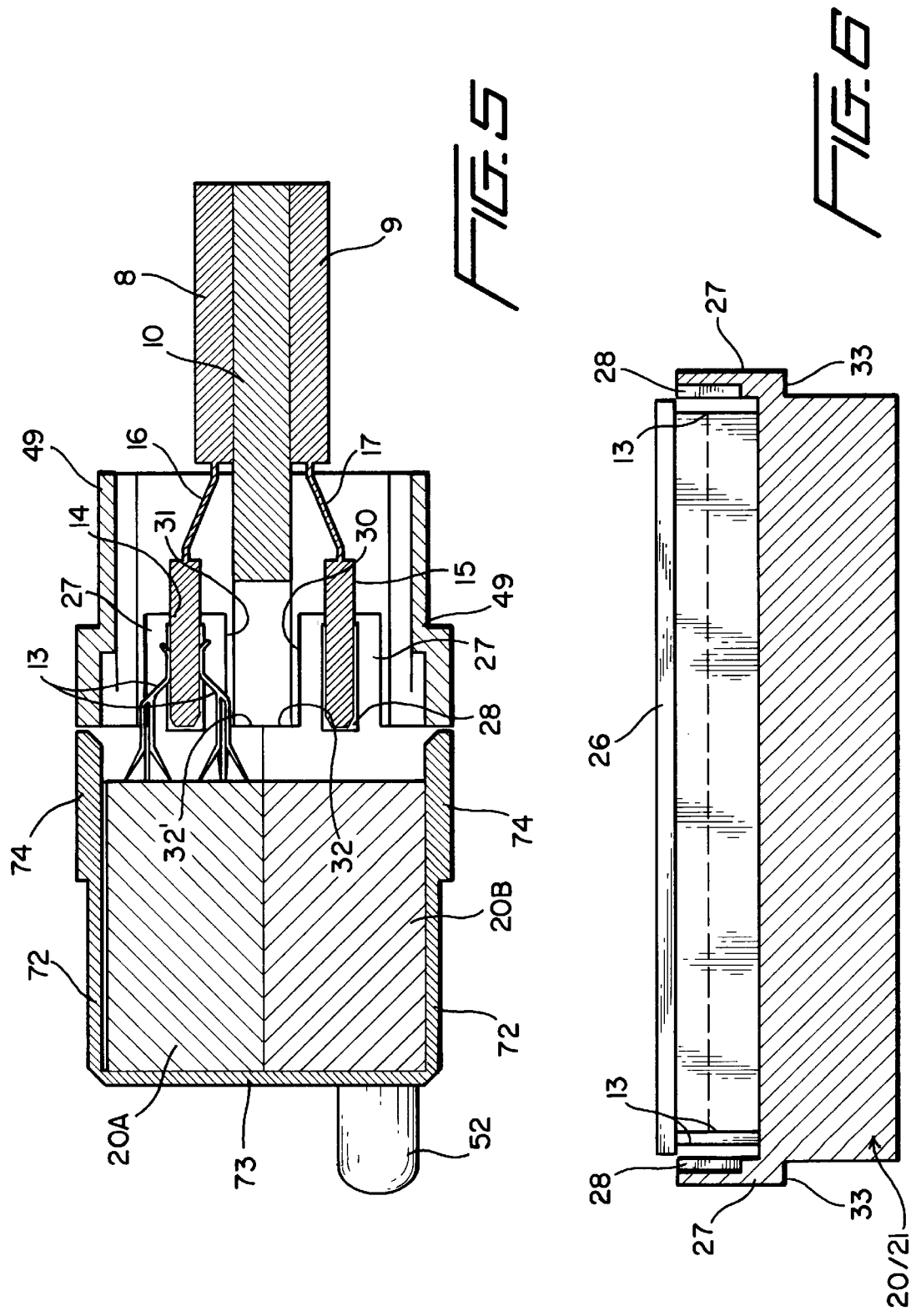

HIGH DENSITY CONNECTOR ARRANGEMENT FOR A CIRCUIT BOARD MODULE

BACKGROUND OF THE INVENTION

1. Field of the Invention

This invention relates to an electrical connector arrangement for a circuit board package, and to a method of assembling electrical connectors to a circuit board. More specifically the invention relates to an arrangement and method for increasing the spacing between contact tails extending from edge connectors of a circuit board module at the point of electrical interconnection between the circuit board and the contact tails.

2. Discussion of Related Art

The problem of electrically connecting complex control circuitry, requiring hundreds of digital input/output lines, to buses or multiple wire cables, has led to the development of the line replaceable module (LRM). The LRM is a standardized electrical connector which contains several hundred electrical contacts arranged in multiple rows, each contact having a solder tail connected to a pad on a circuit board, the circuit board being situated within a chassis or rack.

A principal application of the LRM is in avionics, where space, reliability, and ease of replacement are critical. LRMS serve as circuit modules for aircraft flight control circuitry, and include connectors for interconnecting flight control circuitry situated in separate modules arranged to be mounted in a chassis or rack and interconnected via mating connectors affixed to the backplane of the chassis or rack and buses or cables designed to carry high baud rate digital transmissions to and from the control circuits.

Because of the need for replaceability, and because the space available for the modules is limited, both the size of the circuit board and the size of the connectors are limited, with the LRM standard known as SEM-E, for example, requiring a circuit board having a width of 5.250 inches and a total connector area of 5.44 by 0.580 inches. Even in such a small space, existing technology is capable of packing 360 contacts, providing high density connections suitable for use in most prior systems.

As aircraft become more dependent on electronics, and the density of the electronic circuits themselves has increased through the use of large scale integration, the standard LRM configurations are no longer capable of reliably providing the required number of input/output lines. In order to fully utilize the capacities of large scale circuit integration, the number of required input/output lines currently approaches 500, which is not possible in existing LRM configurations without sacrificing electrical performance and reliability or increasing the size of the interface connectors for the circuit module.

In order to pack 360 contacts in a space as small as that permitted by the SEM-E standard, which is already an impressive accomplishment by ordinary connector design standards, most previous design efforts have focussed on increasing the number of contacts in the connectors, and varying the geometry of the contact tails to most efficiently utilize the available space while maintaining as much symmetry as possible. Thanks to these design efforts, it would actually be possible to pack more than 360 contacts into an SEM-E module, if not for a heretofore inescapable geometrical limitation, namely the limitation that no matter how many rows of contacts are provided for each circuit board interface, all of the contacts must ultimately be connected to the circuit board itself, and the circuit board is a planar structure. Too close a spacing of the contact tails on the circuit board creates intractable assembly problems in aligning the contacts and maintaining uniform separation.

At present, therefore, the main reason that the number of contacts is limited is not the size or arrangement of the contacts in the module connectors, but rather difficulties in electrically connecting the contacts to the circuit boards in the module. While the number of contacts in the connector itself can been increased by increasing the number of rows and using different length contact tails to reach the circuit board, all of the contacts must still be connected to the circuit board itself.

Of course, one solution would be to improve termination techniques so that the terminations could be placed closer together, but even if this were possible, assembly costs would be greatly increased and reliability and electrical performance inevitably affected. Conventional mass soldering techniques permit a solder pad spacing on the circuit board of approximately 0.025 inches, but at higher densities, maintaining separation and accurate spacing between the connections becomes increasingly difficult.

While staggering of the solder pads, i.e., arranging the solder pads into multiple rows, increases the potential contact density, there is limited space on the circuit board for multiple rows, and the use of different length contact tails, even in otherwise symmetrical configurations, presents a number of problems from both an electrical and manufacturing standpoint, including problems of impedance variability and crosstalk between the contact circuits. In addition, these configurations lack sufficient dimensional misalignment compensation or compliance in the contacts to compensate for tolerances in mounting the connector assemblies on the backplane and for float which occurs in conductively cooled modules after the modules have been mated to the backplane and the heatsink is translated normal to the plane of the heatsink until its edges are in intimate contact with the cold walls of a rack or chassis in which the module is mounted.

The conventional LRM configuration is schematically illustrated in FIG. 1. Termination of the connector contacts to the circuit board package, which is in the form of two printed circuit boards 8 and 9 separated by a heatsink 10, is by means of relative long and thin surface mount leads 7 extending from connectors 11 and 12. The leads are formed into a compliant state with the mating ends of the contacts (not shown) being staggered to provide increased contact density within the connector. The compliant form of the contacts permits the contacts to absorb dimensional differences between the connector and the board package. Examples of this type of arrangement are illustrated in U.S. Pat. Nos. 4,734,042 (Martens et al.), 4,808,115 (Norton et al.), 5,090,116 (Henschen et al.), and 5,090,911 (Welsh).

In order to increase the contact density, as indicated above, not only the contacts within the connector, but also the solder pads or terminations on the circuit board can be staggered, as illustrated in U.S. Pat. Nos. 4,992,052 (Verhoeven), 5,308,248 (Davidge et al. ), and 5,342,208 (Kobayashi et al.), but such staggering takes up space on the circuit board which could otherwise be used for electrical components and circuitry, and does not eliminate electrical problems resulting from necessary variations in the geometry and lengths of the contact tails.

Whether just the mating ends of the contacts in the connector are staggered, or both the mating ends and the solder pads or terminations, each of these prior arrangements suffers from the common disadvantages of having solder tails of different lengths and shapes, resulting in impedance variability and crosstalk problems, and of severely limited float, which is the ability to compensate for tolerances in the positioning of the connectors relative to the circuit board.

These problems, which increase with the density of output lines and contacts, affect both the ability of the connectors to handle high speed digital data transmissions, and the reliability of the modules, and are unacceptable in critical avionics applications, or in other military, industrial, and commercial electronics packaging applications where LRM type circuit board interfaces might be used. Without a solution to these problems, in order to fully utilize the capabilities of large scale circuit integration, the existing standards would simply have to be abandoned and more space would need to be provided for the circuit board, requiring re-design of the components in which the modules are housed, a lack of backward compatibility, and significant increases in overall cost of the systems in which the modules are used.

SUMMARY OF THE INVENTION

It is accordingly an objective the invention to overcome the limitations of the prior art by providing an electrical connector arrangement for a circuit board module, and a method of assembling an electrical connector to a circuit board, which offers increased spacing between the points at which the contacts engage the circuit board, thus permitting increased contact density within current module dimensions without sacrificing electrical performance or reliability.

It is also an objective of the invention to provide an electrical connector arrangement for a circuit board module, and a method of assembling an electrical connector to a circuit board, which permits increases in the number of contacts while still providing stable, low resistance electrical connections between the contacts and the printed circuit board.

It is a further objective of the invention to provide an electrical connector arrangement for a circuit board module, and a method of assembling an electrical connector to a circuit board, which permits increases in the number of contacts in the connector, and which absorbs dimensional mismatches between the connector and board package without compromising the electrical and mechanical parameters of the termination.

It is a still further objective of the invention to provide an electrical connector arrangement for a circuit board module, and a method of assembling an electrical connector to a circuit board, which permits increases in the number of contacts, and which permits float or translation of the contacts relative to the module board package.

These objectives are achieved, in accordance with the principles of a first preferred embodiment of the invention, by addressing the basic geometric limitation that has been heretofore limited by termination density of contacts on the circuit board, namely the limitation of terminating multiple rows of contacts in the single plane provided by a surface of the circuit board. Instead of terminating the contacts directly to the principal surface of the circuit board on which the electrical components are situated, the invention provides a connector arrangement in which the tails of contacts in the connector are not terminated to pads or terminals on the main circuit board, but rather are terminated to pads or terminals on pairs of intermediate circuit boards connected to the main boards, the intermediate circuit boards each providing two termination surfaces rather than one, thereby effectively doubling the space available for termination.

In accordance with an exemplary application of the principles of the invention to a standard LRM assembly, the tails of the contacts are solder tails which are surface mounted to the intermediate circuit boards, and the intermediate circuit boards are electrically connected to the main circuit boards by a rigid-flex connection in which the rigid main and intermediate circuit boards are linked by flexible portions carrying traces extending from the main circuit board. The main circuit boards form a standard circuit board package comprised of a heatsink and two circuit boards.

In addition to achieving a center-to-center spacing of the surface mount tails of as large as 0.0375 inches while increasing the number of contacts from 360 to 472, the connection arrangement and method of the preferred embodiments of the invention provides an improved solder tail structure in which the tails are relatively short and stiff in comparison with those of conventional arrangements, and of equal length despite the connector having four rows of contacts, thereby improving the electrical performance and reliability of the contacts without limiting float. Float is permitted by the flexible connections between the intermediate and main circuit boards. The uniform line lengths resulting from solder tails of the same length and configuration mean equal propagation delay, equal line resistance, and equal line inductance. Moreover, by reducing line length, the rigid-flex arrangement can be designed to bring transmission line structures closer to the backplane, minimizing the mismatch zone, and offering the possibility of wider or shunted traces for the transmission of high currents.

Additional features of the connector arrangement and method of the preferred embodiments of the invention include the use of a conventional dielectric insert in which the contacts are positioned and bonded by epoxy, formation of the tails of the contacts in a uniform J-shape to accept the intermediate circuit boards like a conventional card edge connector, the addition of tower features to the dielectric insert to guide and position the intermediate circuit board package relative to the dielectric insert, and stacking of multiple dielectric inserts within a common electrostatic discharge (ESD) shield having a non-conductive outer layer to hold the inserts together, thereby providing a connector which is easier to manufacture, easier to terminate to LRMs, and also electrically superior because each connector has been designed with equal path lengths for each row of contacts.

As a result, the basic concept of providing dual-sided intermediate circuit boards connected to the main circuit board by flexible sections in accordance with the invention overcomes a previously intractable problem and provides a radical new paradigm for circuit board module design which offers dramatic improvements over conventional arrangements and methods. The invention should, therefore, be accorded the broadest possible interpretation, and should not be limited in any way to the specific example discussed below and illustrated in the accompanying drawing figures, except as defined in the accompanying claims.

BRIEF DESCRIPTION OF THE DRAWINGS

FIG. 1 is a schematic illustration of a connector arrangement for a conventional circuit board module.

FIG. 2 is a schematic illustration showing the principle of adding intermediate circuit boards between main circuit boards and the connector insert assemblies according to the principles of the invention.

FIG. 3 is a perspective view showing details of an a partially assembled SEM-E type circuit board module constructed in accordance with the principles of a preferred embodiment of the invention.

FIG. 4 is a perspective view of the assembled circuit board module of FIG. 3.

FIG. 5 is a cross-sectional side view, taken along line C—C of FIG. 4, of an assembled version of the preferred circuit board module.

FIG. 6 is a cross-sectional top view, taken along line D—D of FIG. 11, of a dielectric insert for use in the preferred circuit board module, including contact tails extending from a rear of the insert.

FIG. 9 is an enlarged perspective view showing a portion of the circuit board module of FIG. 4.

DETAILED DESCRIPTION OF THE PREFERRED EMBODIMENTS

1. Basic Principles of the Invention

Figure 7:
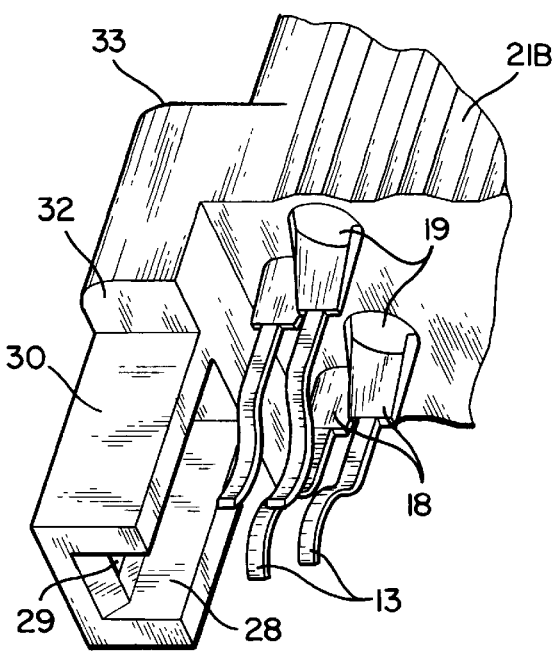
FIG. 7 is a perspective view of a portion of the dielectric insert shown in FIG. 6.

As schematically illustrated in FIG. 2, the connector termination arrangement of the preferred embodiment of the invention includes a circuit board package made up of a pair of printed circuit boards 8 and 9 attached to a frame or heatsink 10, and a pair of connector insert assemblies 11 and 12 each housing a plurality of mating contacts, the tails 13 of which are to be electrically connected to the circuit boards 8 and 9. In order to increase the contact density while providing increased spacing of the circuit board terminations, the termination arrangement of this embodiment makes use of a pair of rigid intermediate circuit boards 14 and 15 connected to the main printed circuit boards by flexible circuit board interconnecting portions 16 and 17.

The circuit board arrangement of this most general embodiment of the invention makes use of an existing circuit board technology referred to by those skilled in the art as a "rigid-flex" circuit board construction, in which the flexible sections 16 and 17 are in the form of multiple printed circuit layers which are extensions of corresponding layers in main circuit boards 8 and 9 to form flexible interconnecting portions between the main circuit board and the intermediate or secondary circuit boards. Although the individual layers are not shown in the drawings, the construction of the flexible sections will be immediately recognized by those in the art of circuit board design and can readily be applied to the illustrated arrangement using known techniques and available components.

The point of the invention is of course to provide dual-sided terminations on the intermediate circuit boards even though each of the main circuit boards has only one available surface, the other surface being unusable because it is in contact with the frame 10, described below as being in the form of a heatsink. The terminations can thus take a variety of forms, including various pin tail configurations, although the illustrated embodiment uses J-shaped surface mount contact tails 13.

It will be appreciated by those skilled in the art that FIGS. 1 and 2 are for purposes of illustrated the basic principles of the invention, and in particular the principle of increasing the spacing of contact terminations to circuit boards by adding intermediate circuit boards, and that no materials or structural details of the circuit boards 8, 14, and 16, frame 10, and insert assemblies 11 have been included in these Figures because the circuit boards can be made of a variety of materials, including layered structures, while the frame 10 does not necessarily need to be a heatsink as described in connection with more specific embodiments of the invention, and the insert assemblies can represent a variety of different connector structures.

2. Overall Layout Of A Preferred Embodiment

A preferred embodiment of the invention which implements the principles illustrated in FIG. 2 is shown in FIGS. 3–12. Although represented as an SEM-E type circuit board module, it should of course be recognized that the principles of the invention may be applied in contexts other than the specific type of module shown.

The overall layout of the preferred module is best illustrated in FIGS. 3–5. The circuit board package comprised of main circuit boards 8 and 9 is arranged such that the heat sink 10 extends forwardly of the main circuit boards, with the intermediate circuit boards 14 and flexible circuit board sections 16 being positioned above and below the heatsink 10 in the manner best illustrated in FIG. 5.

The remaining elements of the circuit board module of this embodiment are:

(1) two pairs of dielectric inserts 20A,20B and 21A,21B;

(2) left and right shields 24 and 25, each enclosing one pair of inserts, and (3) upper and lower shell blocks 36 and 37.

Figure 8:
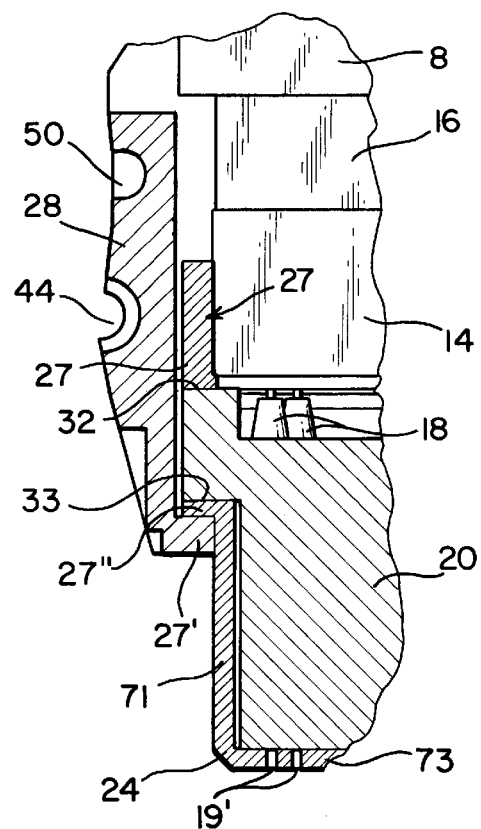
FIG. 8 is a cross-sectional top view, also taken along line D—D in FIG. 11, of a portion of the dielectric insert shown in FIG. 3.

Basically, the functions of the inserts, shields, and shell blocks are as follows:

(1) the dielectric inserts 20A,20B,21A,21B serve to both position the connector contacts for mating with corresponding backplane connectors (not shown) and to position the intermediate circuit boards 14 and 15 relative to the contacts by means of slots 28 in rearward extensions 27 of the inserts (see FIG. 7);

(2) the shields 24 and 25 enclose and position respective pairs 20A,20B and 21A,21B of upper and lower inserts after they are brought together (as is best illustrated by FIG. 3, in which the right side inserts 21A and 21B are shown separated, and the left side inserts 20A and 20B are enclosed within the left shield 24 and therefore not visible in this drawing, and by FIG. 4, in which the right side inserts 21A and 21B have now been brought together, with right side shield 25 having been slid over the inserts from the front so that the inserts are captured within the shield and no longer visible; and (3) the shell blocks capture and position the shield and insert assemblies relative to the heat sink 10 after being slid over the shields from above and below and attached to the heatsink, the shell blocks including flanges 27' which capture a flanges 27" of shields 24 and 25 and the above-mentioned rearward extensions 27 of inserts 20A, 20B, 21A, and 21B, as is best shown in FIG. 8.

Details of the inserts, shields, shell blocks and other elements of the preferred module will now be described.

3. Contact Tail Assemblies

As illustrated in FIGS. 5 and 7, the contact tails 13 which interface with the rigid-flex intermediate printed circuit boards 16 are short, radiused, surface mount tails extending rearwardly from the mating portions 18 of the contacts, and are preferably composed of a high conductivity resilient material such as beryllium copper, having a rectangular cross-section. These contact tails 13 have a smaller width than the mating sections 18 of the contacts and may advantageously be situated eccentrically with respect to the mating sections to achieving a narrower or nearly planar orientation of corresponding pairs for mating with opposite sides of each circuit board while providing an inward bias relative to the intermediate circuit boards in order to provide a centering effect.

The contacts are thus preferably positioned within passages 19 of the dielectric inserts 20 and 21 before termination of the contacts so that the solder tails 13 are aligned to engage corresponding pads on the intermediate circuit boards 14 and 15. To facilitate termination, once the mating sections 18 of the contacts are positioned within openings 19 in dielectric inserts 20 and 21, the contacts may be bonded by epoxy. The epoxy has the advantage of not only retaining the contacts in the dielectric inserts, but also seals the rear surface of the inserts, so that foreign materials such as conformal coatings cannot invade the contacts.

As will be described in more detail below, the intermediate circuit boards 14 and 15 may be advantageous guided into position relative to the dielectric insert pairs 20A,20B and 21A,21B, prior to termination, by slots 28 in extensions 27 to provide a self fixturing arrangement which simplifies termination of the contacts tails to the circuit board. In addition, those skilled in the art will appreciate that in order to ensure correct termination of the contact tails to the intermediate circuit boards, i.e., to ensure that a particular contact is connected to a particular trace on the circuit boards, the intermediate circuit boards and the dielectric inserts may have keying features (not shown) for keying and/or polarizing the assembly to ensure correct assembly by, for example, varying the shape of the slots 28 and including asymmetric structures on the portions of the intermediate circuit boards which fit into the slots.

After the surface mount tails of the contacts have been soldered or otherwise terminated to the intermediate printed circuit boards 14 and 15, the printed circuit boards can be bonded to the dielectric inserts with epoxy, thereby providing a mechanical bond between the printed is circuit boards and the insert assemblies, isolating the surface mount tails and solder joints from mechanical stress. In addition, the solder tails and terminations may be further protected at this point by enclosure within a protective sleeve and potting the structure, so long as the coefficient of thermal expansion of the potting compound matches that of the printed circuit board. This will protect the now completed but relatively fragile insert assembly/contact tails/intermediate circuit board structure during the following assembly steps involving (1) bringing the top insert assemblies 20A,21A and their attached intermediate circuit boards towards their respective bottom insert assemblies 20B,21B with their attached intermediate circuit boards, from the position shown on the right side of FIG. 3 to the position shown in FIGS. 4 and 5, (2) fitting the shields 24 and 25 over respective left and right side pairs of insert assemblies, and (3) capturing the shields and insert assemblies by securing the shell blocks 36 and 37 to the heat sink 10 such that flanges 27' on the shell blocks extend in front of flanges 27" on the shields and extensions 27 of the insert assemblies.

Figure 11:
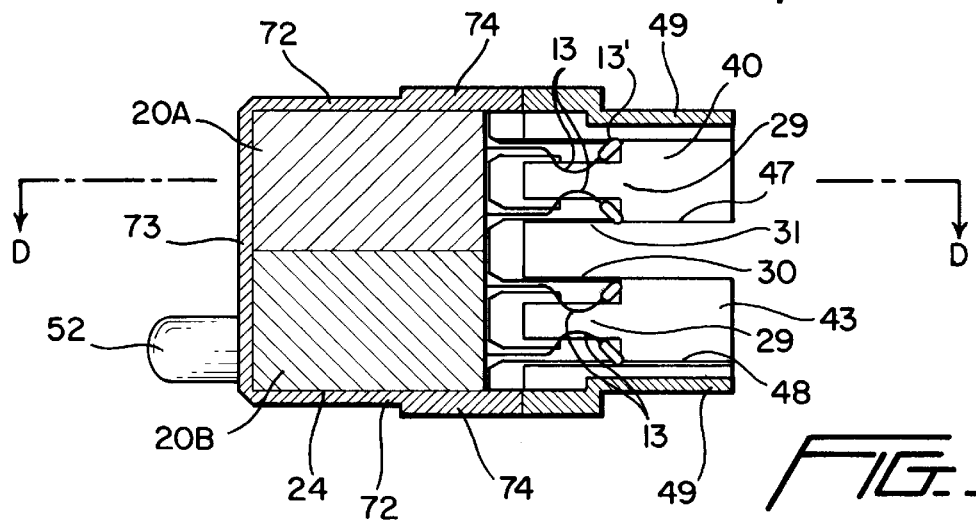
FIG. 11 is a cross-sectional side view, taken along line C—C of FIG. 4, which is identical to that of FIG. 5 but showing the dielectric inserts before assembly of the intermediate circuit boards thereto.
Figure 12:
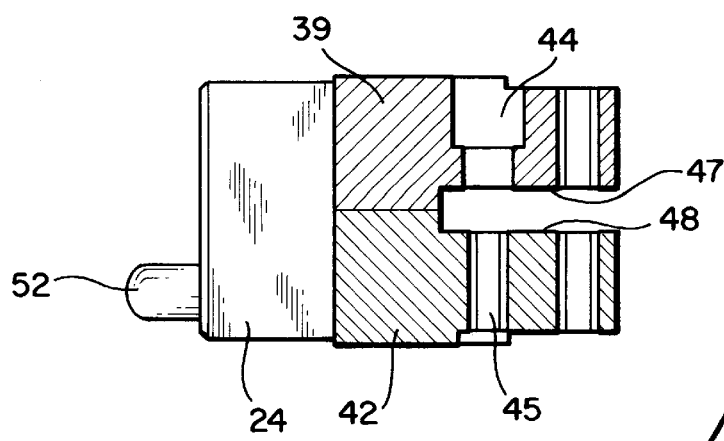
FIG. 12 is a cross-sectional side view, taken along line B—B in FIG. 4, of a central portion of a shell block for use in the preferred circuit board module.

As is apparent from FIG. 5 and 7, all of the surface mount tails are arranged to have essentially the same length, which has the advantage of minimizing impedance variations. In addition, while it is conventional to include tie bars to connect and position the contact tails relative to each other during assembly, after which the tie bars must be removed, the relatively short length of the solder tails may enable alignment to be maintained between the contacts and the solder pads or terminals on the circuit board prior to termination without the need for tie bars, although tie bars 26 can still be utilized if desired as illustrated in FIGS. 6 and 11.

Figure 13A:
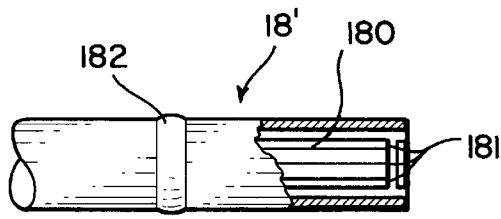
FIGS. 13A and 13B are partial cross-sectional side views of, respectively, a female brush contact and a male brush contact suitable for use with the circuit board module of the preferred embodiment of the invention.
Figure 13B:
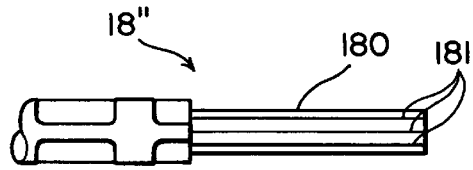
Figure 14A:
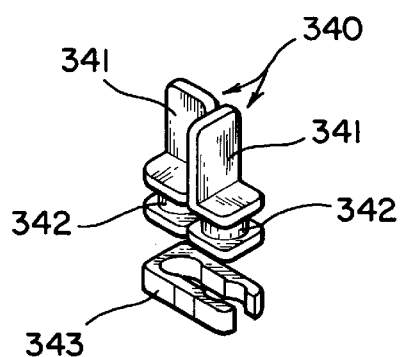
FIGS. 14A and 14B are perspective views of a keying arrangement for, use in the preferred circuit board module.
Figure 14B:
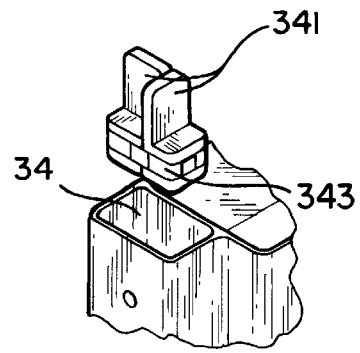
Figure 10:
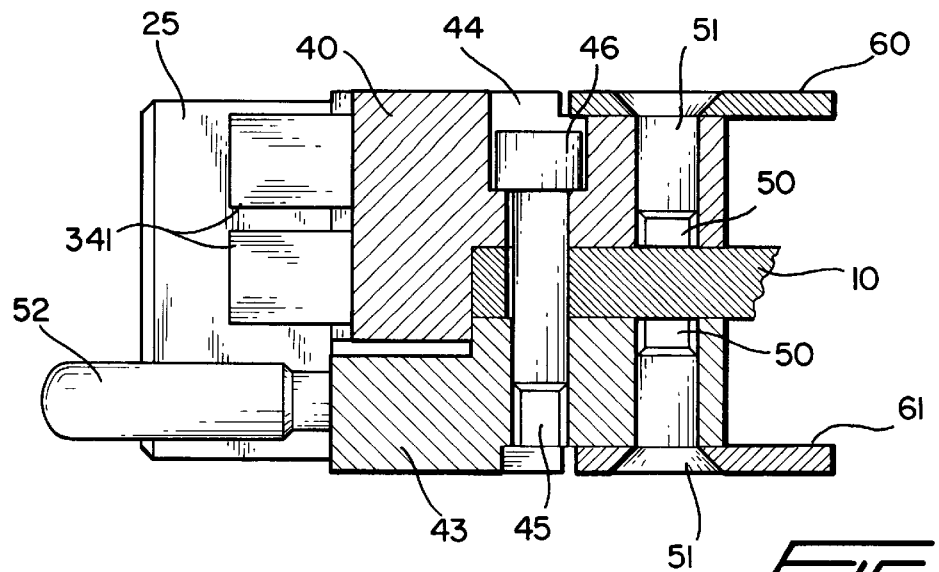
FIG. 10 is a cross-sectional side view, taken along line A—A in FIG. 4, of a side portion of the preferred circuit board module.

Although the mating sections 18 of the contacts, shown in greater detail in FIGS. 13A and 13B, form no part of the present invention, an especially advantageous type of contact is the type of brush contact represented respectively in FIGS. 13A and 13B by female contact 18' and male contact 18", which have the advantage of a low mating force. This type of contact consists of seven 0.007 diameter, gold-plated, beryllium-copper wires 180 crimped into a bundle, the exposed tips 181 of the seven wires being cleaved at a precise angle to create seven extremely sharp points which collectively form a hermaphroditic contact. When two brush bundles are cause to mate, the sharp tips smoothly lead the wires into the crevices of each bundle, wedging themselves down into the bundles as they flare out the bundles so that the uncut diametrical portions of the wires from each bundle interact and create multiple electrical paths from one bundle to the other. The brush contacts are protected by stainless steel sleeves which serve to protect the brush interface from damage and provide a surface to push on the contacts to seat them in the insert. The contacts may be stabilized in the insert assemblies via a detent 182.

4. Dielectric Inserts, Shields, and Shell Blocks

In addition to an improved solder tail termination structure, as indicated above, the preferred embodiment provides various improvements in the connector structure, the shield and ground structure, and the overall module arrangement. These improvements include the provision of flange 27 on the dielectric inserts, which includes slots 28 for supporting the intermediate circuit boards during termination, and the inclusion of a unique shielding/grounding structure made up of shields 24,25 and shell blocks 36,37 arranged to permit the module to be assembled together and grounded, following termination and movement of the dielectric housings into position, simply by inserting the shields over the dielectric inserts, positioning flanges 27' on the shell blocks such that flanges 27 on the inserts and 27" on the shields are retained between flanges 27' and the heatsink, and fastening the shell blocks to the heatsink.

The overall configuration of the dielectric inserts 20A, 20B,21A,21B is best seen from FIGS. 3, 5, and 6. The portion of the inserts which contain passages 19 is conventional in shape, with extensions 27 extending rearwardly from the contact containing portions and also to the side, as best shown in FIG. 6. The rear inside portions of the extensions 27 contain slots 28 for guiding and position the intermediate circuit boards, including polarization features if desired, while the front portion of the extensions 27 form a surface 33 against which flange 27" of the shields 24 and 25 are captured by flange 27' after positioning of the shell blocks 36 and 37 as shown in FIG. 8. Optionally, slots 28 may include rails 29 to help keep the intermediate circuit board within the slots, and which can also serve as keying or polarization features if asymmetrically arranged, while notches 30 and 31 (the later shown only in FIGS. 5 and 11) may be formed respectively on the upper side of extensions 27 of lower inserts 21A,21B and on the lower side of extensions 27 of upper inserts 20A,20B to provide clearance for heat sink 10 when the upper and lower inserts are brought together.

The ESD shields 24 and 25 illustrated in FIGS. 3–5 and 9 not only serve to intercept ESD before it can find its way to a brush contact by forming a Faraday cage structure, but also holds together the insert assemblies which make up the insert bays of the connector/circuit board module, and are the second feature of the module to interface with the backplane connector during mating. To this end, each shield includes a main portion 70 including side walls 71, upper and lower walls 72 which fit over and holds together respective pairs 20A,20B and 21A, 21B of upper and lower inserts, the above-described flanges 27", and front walls 73 including the above-described openings 19' to permit entry of contacts of the mating backplane connectors, as well as rearward extensions 74 section for engaging shell blocks 36 and 37.

As best shown in FIGS. 3, 4, 9, 10, and 12, the metal shell block 36 includes tower portions 38–40 and the lower shell block 37 includes portions 41–43 which serve both to capture flanges 27" of shields 24 and 25 against front surfaces 33 of dielectric insert extensions 27, and also to attach the shell blocks to heatsink 10. Capture of the shield flanges is accomplished by flanges 27' which extend inwardly from the front side of the tower structures 38–40 and lower shell block portions 41–43, while connection to the heatsink is by means of locking members 46 which pass through openings 44 situated towards the rear of tower portions 38–40 and through threaded holes 45 in portions 41–43 so as to lock the heatsink between lower surfaces 47 of upper shell block 36 and upper surfaces 48 of lower shell block 37. Because the shields and inserts are captured only from the front side, it will be appreciated that the illustrated structure will hold the shields and inserts against movement in the plane of the circuit board while advantageously permitting movement in the vertical directions to permit float, as discussed above.

Further details of the shell blocks 36 and 37 include cover mounting extensions 49, which form a shelf for mounting of module cover members 60 and 61, and which include screw holes 50 for cover mounting screws 51, as well as openings or pockets 34 for replaceable connector keying, and openings for guide/ground pins 52.

The shell blocks as illustrated thus serve to retain the insert assemblies and ESD shields together and lock them to the heatsink, while at the same time permitting vertical movement of the shields and inserts relative to the heat sink and main circuit boards, and providing a ground path from the cover, shields, and ground pins to the heatsink. It will be appreciated, however, that while the shell blocks 36 and 37 are illustrated as being continuous structures, including connecting sections 53 and 55, one or both of shell blocks 36 and 37 could also be made of separate structures corresponding to the respective portions 38–40 and 41–43.

5. Additional Structures: Guide Pins, Module Keying Features and Cover

Mechanically, the guide pins 52 are the first feature of the completed module to engage the backplane connector during installation of the module in a chassis or rack, serving to provide an amount of radial pickup to initiate engagement and, when engaged with the backplane connector, to provide low resistance engagement between the shields 24 and 25 of the module, via flanges 27" and shell blocks 36 and 37, and the mating backplane connectors. Preferably, the pins are composed of gold plated, hard beryllium-copper but are designed so that if they are mis-handled they will break rather than bend so as to the prevent connectors from being damaged during mating due to bent guide/ground pins.

While not absolutely necessary to the function of the preferred module, the keying features shown in FIGS. 9A and 9B are useful to prevent improper installation of the module on the chassis or rack containing the backplane to which the module is to be electrically connected. Each of the openings 34 accommodates two keys 340 having an eccentrically positioned extension 341 which defines the corresponding key receiving opening, with each of the four keys being settable in four different positions by rotating a base portion 342 of the keys within a retaining member 343, for a total of 256 different keyhole combinations. Unless the chassis has more than 256 module slots, this is sufficient to ensure that each module will only be able to be connected to the proper slot.

Finally, those skilled in the art will appreciate that, although not shown, cover members 60 and 61 may extend rearwardly to completely enclose the circuit board package, and that the dimensions and exterior configuration of the module should be the same as those of the conventional module which the present invention is designed to replace so that, from the outside, the preferred module is indistinguishable from the conventional module except with respect to the number of contact pins in the backplane connectors.

6. Method of Assembly

It will be apparent from the above description that the module illustrated in FIGS. 2–13 provides an arrangement in which termination of the module circuit board to the connector contacts via a rigid-flex printed circuit board has been greatly simplified. The contacts of the individual inserts straddle the printed circuit board and are formed to compress the board like a card-edge connector. The slots at each end of the dielectric inserts guide the rigid interface board of the rigid-flex into the correct position for termination, while self-fixturing of the inserts is made possible because of the wider pitch of the surface mount leads. Preferably, the insert assemblies are mounted to the rigid-flex printed circuit board prior to the attachment of the printed circuit board to the heatsink, so as to minimize A and B side registration problems, and the insert assemblies are subsequently brought together and secured by first fitting the shields over the insert assemblies and then mounting the shell blocks on the heatsink in a position which captures and locks both the shells and the insert assemblies into position relative to the heatsink and circuit boards.

As a result, the arrangement illustrated in FIGS. 2–13 can easily be assembled by the following method;

Initially, the mating sections 18 of the contacts are positioned within openings 19 in dielectric inserts 20 and 21, the contacts are bonded by epoxy. The intermediate circuit boards 14 and 15 are then positioned within slots 28 relative to the rows of contact tails 13, before the heatsink 10 has been placed in its final position, and the tails are soldered into position. After the contact tails have been soldered to the intermediate circuit boards, the intermediate circuit boards are bonded to the dielectric insert with epoxy, and the surface mount tails are optionally potted to complete the termination procedure.

The circuit card assemblies made up of the contacts, intermediate circuit boards and dielectric inserts may then, in the illustrated embodiment, be positioned relative to the main circuit boards and heatsink, making use of the flexibility of the flexible portions 16 of the package, so that quarter insert assemblies or half bays 20A,20B,21A,21B come together with the circuit boards to make complete bays, with surfaces 30 and 31 of extensions 27 forming guide slots for the heatsink. The ESD shields 24 and 25 are then carefully installed to hold the insert assemblies together in a vertical direction.

After the insert assemblies have been terminated to the intermediate circuit boards and the ESD shields assembled over the insert assembly, the assemblies straddle the heatsink in roughly their final position. The upper and lower shell blocks 36 and 37 can then be slid into position from above and below the ESD shields 24 and 25, down along the vertical axis, and the three locking members are then installed from the upper shell block through the heatsink into the lower shell block while a vertical force is applied to the shell blocks as necessary to keep the plastic extensions of the dielectric inserts flush to the edge of the heatsink, and finally the entire assembly may optionally be vacuum baked to any epoxy which has been applied to the various parts to assist in fixing the parts following positioning.

Having thus described a preferred embodiment of the invention, those skilled in the art will appreciate that numerous variations and modifications of the preferred embodiment, such as variations in the manner of contact termination to the intermediate circuit boards, variation in the contact structure, modification of the shielding/cover arrangement or the shell block structure, and application of the principles of the invention to circuit board modules other than those arranged to meet the SEM-E standard and in contexts other than avionics, may nevertheless be made without departing from the scope of the invention.

For example, while the illustrated embodiment provides just one intermediate circuit board between the main circuit board and the contact tails, those skilled in the art will appreciate that the rigid-flex concept could also be used to flexibly connect multiple intermediate circuit boards to the main circuit board or boards, and/or that additional flexible sections could be provided to connect intermediate circuit boards with sub-intermediate circuit boards, further increasing the available contact termination space.

It is accordingly intended that the invention not be limited by the above description or accompanying drawings, but that it be defined solely in accordance with the appended claims.

We claim:

1. An arrangement for electrically connecting a plurality of contact tails extending from contacts in an electrical connector to electronic components mounted on one surface of a rigid main circuit board, wherein the contacts in the electrical connector are arranged in at least two rows, comprising:

a rigid intermediate circuit board having two oppositely facing principal surfaces, a first group of said contact tails being terminated only to a first of said two surfaces and a second group of said contact tails being terminated only to a second of said two surfaces; and a flexible circuit board section extending between said main circuit board and said intermediate circuit board for electrically interconnecting said contact tails terminated to said first surface of the intermediate circuit board and said contact tails terminated to said second surface of the intermediate circuit board with said components on said one surface of the main circuit boards whereby said contact tails of said first and second groups, and therefore said electrical contacts arranged in at least two rows, are thereby electrically interconnected with said electronic components on said one surface of the main circuit board.

2. An arrangement as claimed in claim 1, wherein said contact tails are terminated to said intermediate circuit board by surface mounting.

3. An arrangement as claimed in claim 1, further comprising a second main circuit board having one surface to which electronic components are mounted, a second intermediate circuit board having two principal surfaces to which contact tails are terminated, a second flexible section between said second main circuit board and said second intermediate circuit board , and a heatsink sandwiched between said first and second main circuit boards.

4. An arrangement as claimed in claim 3, wherein said contact tails extend from contacts positioned within passages in dielectric inserts of electrical connectors.

5. An arrangement as claimed in claim 4, wherein said contact tails extend eccentrically from said contacts such that pairs of upper and lower contact tails are nearly planar.

6. An arrangement as claimed in claim 4, wherein said dielectric inserts include extensions having slots for guiding said intermediate circuit boards between rows of upper and lower contact tails.

7. An arrangement as claimed in claim 6, wherein an upper surface of an extension on a lower one of said inserts faces a lower surface on an extension of an upper one of said inserts to sandwich said heatsink when said upper insert is moved vertical relative to said lower insert.

8. An arrangement as claimed in claim 7, further comprising an electro-static discharge shield surrounding top, side, and front surfaces of said inserts.

9. An arrangement as claimed in claim 8, further comprising upper and lower shell blocks positioned such that flanges on said shell blocks capture said extensions of the dielectric inserts and flanges on said shields and lock the inserts and shields to the heatsink when the shell blocks are fastened to the heatsink.

10. An arrangement as claimed in claim 9, further comprising a cover secured to said shell blocks for enclosing said circuit boards and forming an electronic circuit board module for mounting in a rack, said connectors being arranged to mate with mating connectors on a backplane of said rack.

11. An arrangement as claimed in claim 10, wherein shell blocks ground said cover and said shields to said heatsink, and wherein forces on said contacts during mating are transmitted through said inserts and shell blocks to said heatsink.

12. An arrangement as claimed in claim 10, further comprising pockets in one of said shell blocks for containing keying members, and openings for including guide pins for securing said connectors of said module to said mating connectors, said guide pins also being grounded to said heatsink via said shell blocks.

13. An arrangement as claimed in claim 10, wherein said module is an SEM-E standard circuit board module.

14. An arrangement as claimed in claim 7, further comprising upper and lower shell blocks positioned such that flanges on said shell blocks capture said extensions of the dielectric inserts and lock the inserts to the heatsink when the shell blocks are fastened to the heatsink.

15. An arrangement as claimed in claim 4, further comprising an electro-static discharge shield surrounding top, side, and front surfaces of said inserts.

16. An arrangement as claimed in claim 15, further comprising upper and lower shell blocks positioned such that flanges on said shell blocks capture said extensions of the dielectric inserts and flanges on said shields and lock the inserts and shields to the heatsink when the shell blocks are fastened to the heatsink.

17. A method of electrically connecting a plurality of contact tails extending from contacts in an electrical connector to electronic components mounted on one surface of a rigid main circuit board, said electrical contacts in the electrical connector being arranged in at least two rows, comprising the steps of:

prov255ng a rigid intermediate circuit board having two oppositely facing principal surfaces, said rigid intermediate circuit board including traces on said two opposite facing principal surfaces, said traces being electrically connected by a flexible circuit board section to said electronic components on said main circuit board;

terminating a first group of the contact tails only to said first principal surface of said intermediate circuit board; and terminating said second group of the contact tails only to said second principal surface of the intermediate circuit board.

18. A method as claimed in claim 17, wherein the step of electrically connecting the contact tails comprises the step of surface mounting the contact tails on said opposite side of the circuit board.

19. A method as claimed in claim 18, further comprising the steps of positioning contacts to which the contact tails are attached in openings in a dielectric insert of a connector, and positioning the intermediate circuit board in a slot in said insert during electrical connection of the contact tails to the opposite sides of the intermediate circuit board.

20. A method as claimed in claim 19, further comprising the step of terminating additional rows of contact tails attached to contacts positioned in openings in a second dielectric insert to opposite sides of a second intermediate circuit board connected to a second main circuit board by a second flexible interconnection section, said first and second main circuit board sandwiching a planar heatsink.

21. A method as claimed in claim 20, further comprising the step of vertical moving said first and second dielectric inserts towards each other following termination of the contact tails to said intermediate circuit boards.

22. A method as claimed in claim 21, further comprising the step of fitting an electrostatic discharge shield over said dielectric members after said dielectric members have been brought together.

23. A method as claimed in claim 22, further comprising the steps of positioning the shell blocks such that extensions of said dielectric members capture and flanges on said shield against said heat sink, and subsequently fastening said shell blocks to said heatsink.

24. A method as claimed in claim 23, further comprising the step of attaching cover members to said shell blocks to form a circuit board module arranged to be mounted within a rack, with said connector being arranged to mate with a mating connector on a backplane of said rack.

\* \* \* \* \*

UNITED STATES PATENT AND TRADEMARK OFFICE
CERTIFICATE OF CORRECTION

PATENT NO. : 5,947,753

DATED : September 7, 1999

INVENTOR(S) : Chapman et al.

It is certified that an error appears in the above-identified patent and that said Letters Patent is hereby corrected as shown below:

Column 3, line 22, after "objective" insert --of--.

Column 6, line 11, change "illustrated" to --illustrating--;
      line 54, change "3," to --3),--.

Column 11, line 67, after "boards" insert --,--.

Column 12, line 14, delete the space between "board" and ",".

Column 13, line 14, change "opposite" to --oppositely--.

Signed and Sealed this

Twenty-second Day of May, 2001

Attest:

NICHOLAS P. GODICI

Attesting Officer    Acting Director of the United States Patent and Trademark Office